(12) United States Patent
Park et al.

(10) Patent No.: US 9,461,864 B2
(45) Date of Patent: Oct. 4, 2016

(54) APPARATUS AND METHOD FOR ADAPTIVELY SELECTING CHANNEL CODE BASED ON NON-GAUSSIANITY OF CHANNEL IN WIRELESS COMMUNICATION SYSTEM

(71) Applicant: Samsung Electronics Co., Ltd., Gyeonggi-do (KR)

(72) Inventors: Woo-Myoung Park, Gyeonggi-do (KR); Sang-Min Kim, Gyeonggi-do (KR); Chi-Woo Lim, Gyeonggi-do (KR)

(73) Assignee: Samsung Electronics Co., Ltd (KR)

( * ) Notice: Subject to any disclaimer, the term of this patent is extended or adjusted under 35 U.S.C. 154(b) by 0 days.

(21) Appl. No.: 14/686,425

(22) Filed: Apr. 14, 2015

(65) Prior Publication Data

US 2015/0222472 A1 Aug. 6, 2015

Related U.S. Application Data

(63) Continuation of application No. 14/593,398, filed on Jan. 9, 2015, now Pat. No. 9,036,735.

(30) Foreign Application Priority Data

Jan. 13, 2014 (KR) ........................ 10-2014-0004196

(51) Int. Cl.
| | |
|---|---|
| H04L 27/36 | (2006.01) |
| H04B 1/04 | (2006.01) |
| H04B 1/10 | (2006.01) |
| H04L 1/00 | (2006.01) |
| H04L 1/08 | (2006.01) |

(Continued)

(52) U.S. Cl.
CPC .......... *H04L 27/366* (2013.01); *H03M 13/253* (2013.01); *H03M 13/256* (2013.01); *H04B 1/0475* (2013.01); *H04B 1/1027* (2013.01); *H04L 1/0009* (2013.01); *H04L 1/08* (2013.01); *H04L 1/20* (2013.01); *H04L 27/362* (2013.01); *H04L 27/38* (2013.01); *H03M 13/2933* (2013.01); *H04L 1/0057* (2013.01); *H04L 1/0071* (2013.01)

(58) Field of Classification Search
CPC .. H04B 7/0669; H04B 1/0475; H04B 1/027; H03M 13/1194; H03M 13/353; H03M 13/611; H04L 1/0009; H04L 27/366
See application file for complete search history.

(56) References Cited

U.S. PATENT DOCUMENTS 6,629,287 B1 * 9/2003 Brink ........................... 714/755
2003/0066015 A1 4/2003 Sehier (Continued)

OTHER PUBLICATIONS

Stephan Ten Brink, "Coding Over Space and Time for Wireless Systems", IEEE Wireless Communications, Aug. 2006.

(Continued)

*Primary Examiner* — Curtis Odom
(74) *Attorney, Agent, or Firm* — The Farrell Law Firm, P.C.

(57) ABSTRACT

A method and apparatus are provided for adaptive channel code selection according to a non-Gaussianity of a channel in a wireless communication system. A method includes receiving channel feedback information from a receiving node; selecting, based on the channel feedback information, a channel code among a plurality of channels code having different degree distributions of repetition codes; and encoding transmission data based on the selected channel code.

26 Claims, 16 Drawing Sheets

(51) Int. Cl.
  *H04L 1/20* (2006.01)
  *H04L 27/38* (2006.01)
  *H03M 13/25* (2006.01)
  *H03M 13/29* (2006.01)

(56) References Cited

U.S. PATENT DOCUMENTS

| | | |
|---|---|---|
| 2003/0223512 A1 | 12/2003 | Ahmed et al. |
| 2006/0233272 A1* | 10/2006 | Raghavan ............. H04L 1/0003 375/260 |
| 2008/0016426 A1 | 1/2008 | Li et al. |
| 2009/0316815 A1* | 12/2009 | Glazko et al. ................ 375/260 |
| 2011/0044398 A1 | 2/2011 | Dowling et al. |
| 2011/0142179 A1* | 6/2011 | Cheun ................... H04L 25/067 375/341 |

OTHER PUBLICATIONS

Mike Novey et al., "Circularity and Gaussianity Detection Using the Complex Generalized Gaussian Distribution", IEEE Signal Processing Letters, Nov. 2009.

Shi Cheng et al., "Coherent Continuous Phase Frequency-Shift Keying: Parameter Optimization and Code Design", IEEE Transactions on Wireless Communications, Apr. 2009.

European Search Report dated May 20, 2015 issued in counterpart application No. 15150989.0/1851.

* cited by examiner

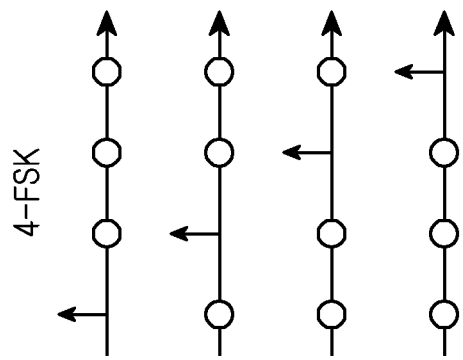
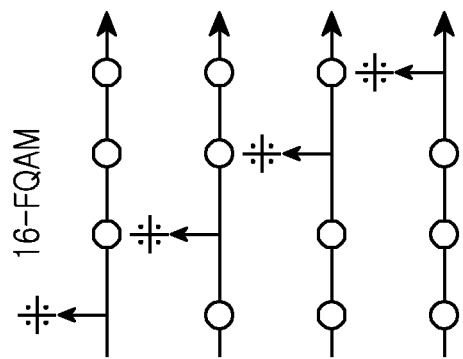
FIG.1C
FIG.1B
FIG.1A

US 9,461,864 B2

APPARATUS AND METHOD FOR ADAPTIVELY SELECTING CHANNEL CODE BASED ON NON-GAUSSIANITY OF CHANNEL IN WIRELESS COMMUNICATION SYSTEM

PRIORITY

This application is a Continuation of U.S. application Ser. No. 14/593,398, which was filed in the U.S. Patent and Trademark Office on Jan. 9, 2015, and claims priority under 35 U.S.C. §119(a) to Korean Patent Application Serial No. 10-2014-0004196, which was filed in the Korean Intellectual Property Office on Jan. 13, 2014, the content of which is incorporated herein by reference.

BACKGROUND OF THE INVENTION

1. Field of the Invention

The present invention relates to a channel code in a wireless communication system.

2. Description of the Related Art

To perform low complexity decoding, conventional art assumes a Gaussian distribution of an interference signal. Therefore, a modulation method of a Quadrature Amplitude Modulation (QAM) series is commonly used to approximate a characteristic of the interference signal to a Gaussian function (or Gaussian).

However, it is widely known that a non-Gaussian channel actually has a bigger channel capacity than a Gaussian channel. Consequently, if decoding is properly performed, a non-Gaussian channel can provide greater decoding performance than a Gaussian channel.

Accordingly, research has been conducted on a modulation method in which an interference signal follows a non-Gaussian distribution. For example, a proposed modulation method is Frequency-QAM (FQAM), which is a hybrid modulation method combining QAM and Frequency Shift Keying (FSK). FQAM has all the merits of increasing a spectral efficiency of the QAM and making an interference signal of the FSK non-Gaussian.

If a QAM series is used for modulation, generally, a statistic characteristic of an interference signal follows a Gaussian distribution. As a result, it is common that one code, which is optimally designed considering an Additive White Gaussian Noise (AWGN) channel, is used in a system. Accordingly, a Base Station (BS) and a terminal have information about a channel code of one kind in accordance to a given modulation method and coding rate.

However, if FQAM is used for modulation, a statistic characteristic of an interference signal follows a non-Gaussian distribution, and a code having optimal performance can differ, based on a non-Gaussianity of a channel. Therefore, when only one channel code is used, as in the conventional art, if the used channel code is a code optimized to a channel having small non-Gaussianity, decoding performance may deteriorate in an environment having higher non-Gaussianity.

Basically, a channel code that is optimized for an environment in which an interference signal follows a Gaussian distribution may not provide the same optimal performance in a non-Gaussian channel. Similarly, a channel code optimized for an environment in which an interference signal follows a non-Gaussian distribution may not provide optimal performance in a Gaussian channel.

SUMMARY OF THE INVENTION

Accordingly, the present invention is designed to address at least the problems and/or disadvantages described above and to provide at least the advantages described below.

An aspect of the present invention is to provide an apparatus and method for efficiently performing channel encoding and decoding in consideration of a characteristic of a channel in a wireless communication system.

Another aspect of the present invention is to provide an apparatus and method for adaptively selecting a channel code in accordance to a non-Gaussianity of a channel in a wireless communication system.

Another aspect of the present invention is to provide an apparatus and method for estimating a non-Gaussianity of a channel in a wireless communication system.

In accordance with an aspect of the present invention, a method for operating a transmitting node in a wireless communication system, the method comprising: receiving channel feedback information from a receiving node; selecting, based on the channel feedback information, a channel code among a plurality of channels code having different degree distributions of repetition codes; and encoding transmission data based on the selected channel code.

In accordance with another aspect of the present invention, a method is provided for operating a receiving node in a wireless communication system. The method includes receiving encoded data from a transmitting node; selecting, based on channel feedback information, a channel code among a plurality of channels code having different degree distributions of repetition codes; and decoding the encoded data based on the selected channel code.

In accordance with another aspect of the present invention, an encoding device is provided for encoding data in a wireless communication system. The encoding device includes a processor configured to select, based on the channel feedback information received from a receiving node, a channel code among a plurality of channels code having different degree distributions of repetition codes and to encode transmission data based on the selected channel code; and a transceiver configured to transmit the encoded transmission data.

In accordance with another aspect of the present invention, a decoding device is provided for decoding data in a wireless communication system. The decoding device includes a transceiver configured to receive encoded data from a transmitting node; and a processor configured to select, based on channel feedback information, a channel code among a plurality of channels code having different degree distributions of repetition codes and to decode the encoded data based on the selected channel code.

BRIEF DESCRIPTION OF THE DRAWINGS

The above and other aspects, features, and advantages of certain embodiments of the present invention will become more apparent from the following detailed description when taken in conjunction with the accompanying drawings, in which:

FIGS. 1A, 1B, and 1C illustrate an example of a FQAM method according to an embodiment of the present invention;

DETAILED DESCRIPTION OF EMBODIMENTS OF THE INVENTION

Various embodiments of the present invention will be described herein below with reference to the accompanying drawings. In the following description, specific details such as detailed configuration and components are merely provided to assist the overall understanding of these embodiments of the present invention. Therefore, it should be apparent to those skilled in the art that various changes and modifications of the embodiments described herein can be made without departing from the scope and spirit of the present invention. In addition, descriptions of well-known functions and constructions are omitted for clarity and conciseness.

The present invention relates generally to a channel code in a wireless communication system, and more particularly, to a method and apparatus for adaptive channel selection according to a non-Gaussianity in a wireless communication system. Herein, the term "non-Gaussianity" is used to represent whether an interference or noise of a channel follows a non-Gaussian distribution, the extent of a non-Gaussian, etc.

FIGS. 1A, 1B, and 1C illustrate an example of an FQAM scheme according to an embodiment of the present invention. Specifically, FIG. 1 illustrates FQAM, which is a combination of 4-QAM and 4-FSK.

Referring to FIG. 1A, the 4-QAM has four constellation points in a rectangular coordinate system, thereby being able to generate four complex symbols having different phases.

Referring to FIG. 1B, the 4-FSK uses four frequency values, thereby being able to generate four complex symbols having different frequency values.

Referring to FIG. 1C, the FQAM is a combination of the 4-QAM and the 4-FSK. The FQAM symbols can have four different frequency values and four different phase values, so that a total of sixteen different symbols can be generated.

The FQAM extends the number of bit streams expressible by QAM by a frequency count, mapping a QAM symbol to a frequency. In other words, the FQAM extends the number of bit streams expressible with FSK by a QAM symbol count, using a phase and size of an FSK symbol. Accordingly, an FQAM symbol is identified by a combination of a phase and size of the symbol and a position on a frequency in which the symbol is mapped.

A Coded Modulation (CM) scheme using a non-binary Low Density Parity Code (LDPC) code and a Bit-Interleaved Coded Modulation with Iterative Decoding (BICM-ID) scheme using a binary code may be used to achieve a channel capacity when applying an FQAM modulation scheme. The BICM-ID scheme includes an irregular repetition code based outer code and a trellis code based inner code. The BICM-ID scheme shows performance similar to the non-binary LDPC code, and has a relatively low complexity.

Figure 2:
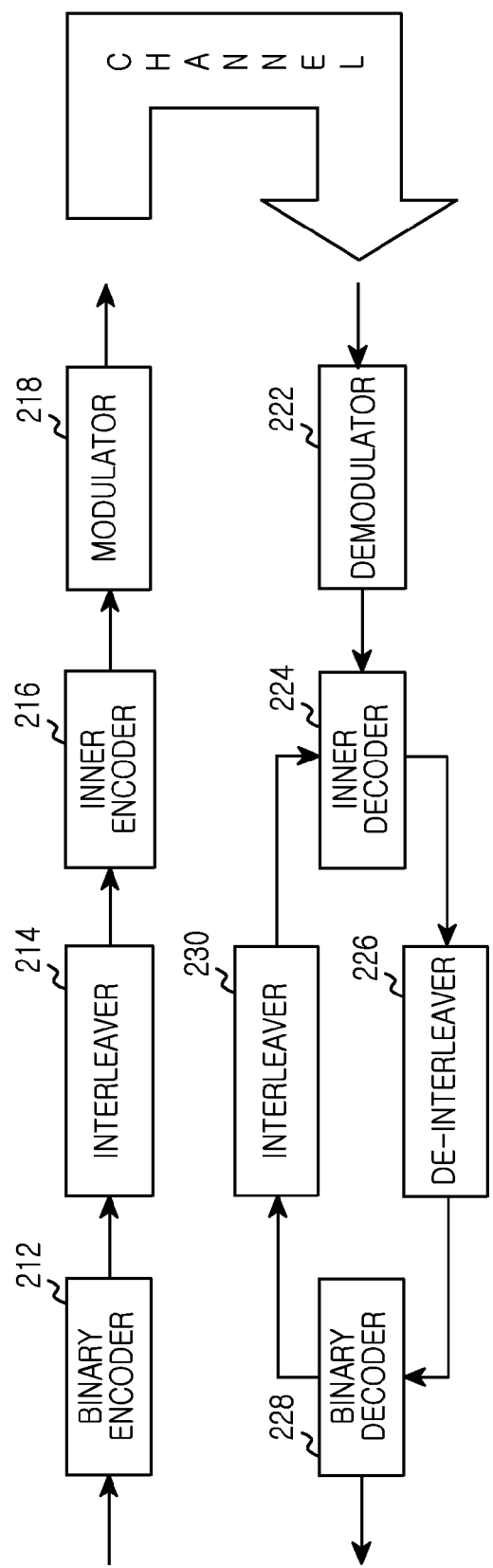
FIG. 2 illustrates an encoding and decoding structure in a wireless communication system according to an embodiment of the present invention.

FIG. 2 illustrates an encoding and decoding structure in a wireless communication system according to an embodiment of the present invention.

Referring to FIG. 2, a transmitting node includes a binary encoder 212 for binary encoding based outer encoding of a transmission bit stream, an interleaver 214 for interleaving the binary encoded bit stream, an inner encoder 216 for performing trellis based inner encoding of the interleaved bit stream, and a modulator 218 for mapping the inner encoded bit stream to a complex symbol.

A receiving node includes a demodulator 222 for de-mapping a complex symbol to a bit stream, an inner decoder 224 for performing trellis based inner decoding of the de-mapped bit stream, a de-interleaver 226 for de-interleaving the inner decoded bit stream using a rule corresponding to the interleaving performed by the transmitting node, a binary decoder 228 for performing binary based outer decoding of the de-interleaved bit stream, and an interleaver 230 for interleaving an output of the binary decoder 228.

Figure 3:
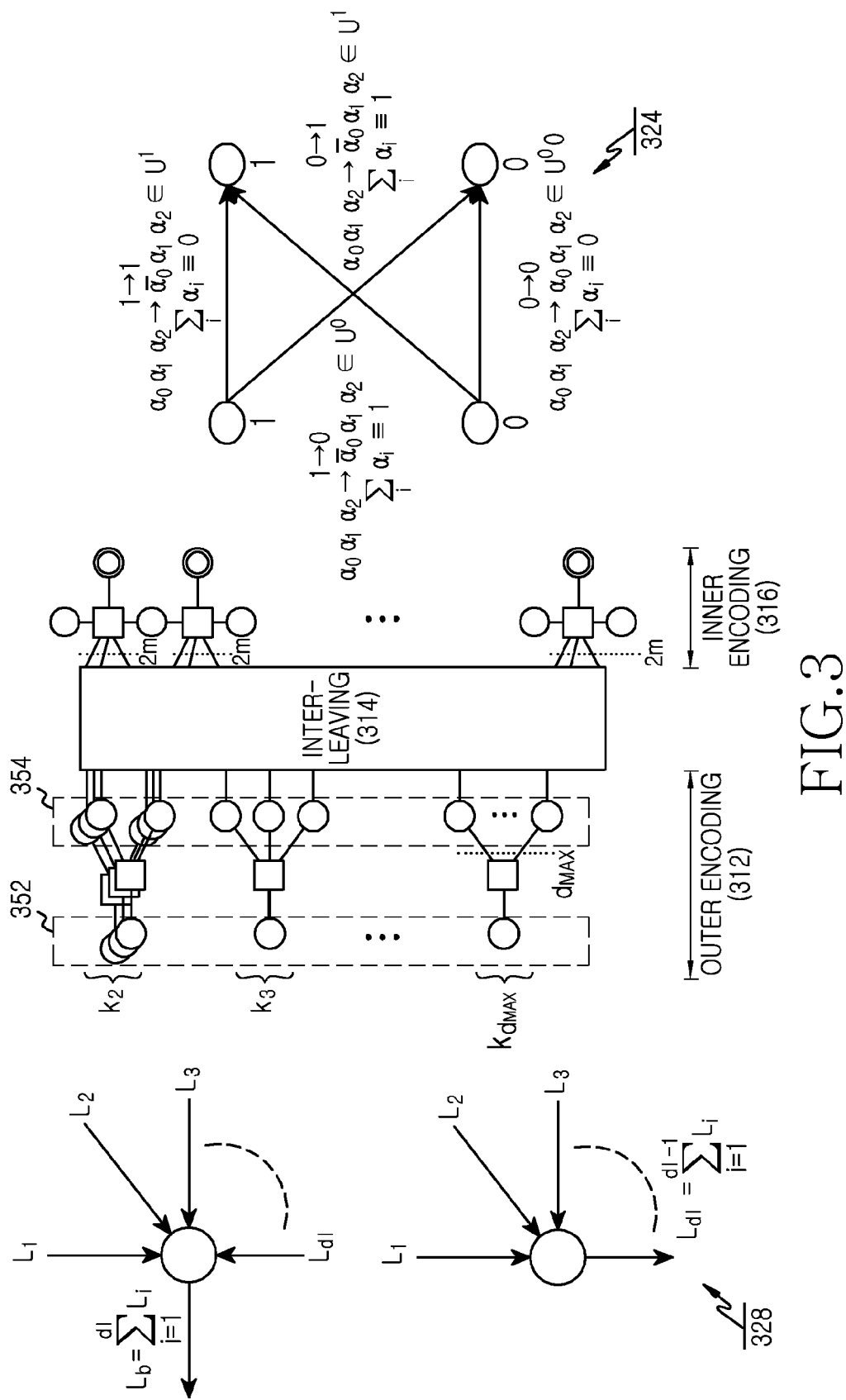
FIG. 3 illustrates concepts of encoding and decoding in a wireless communication system according to an embodiment of the present invention.

FIG. 3 illustrates a concept of encoding and decoding in a wireless communication system according to an embodiment of the present invention. Specifically, FIG. 3 conceptually illustrates outer encoding 312 as performed by the binary encoder 212 illustrated in FIG. 2, interleaving 314 as performed by the interleaver 214 illustrated in FIG. 2, and inner encoding 316 as performed by the inner encoder 216 illustrated in FIG. 2.

Referring to FIG. 3, a message vector 352 of bits to be transmitted is outer encoded (312). For example, the number of bits of the message vector 352 is represented as 'k', where $k = k_2 + k_3 + \ldots + k_{d_{MAX}}$.

A codeword 354 is generated by repeatedly outer encoding each bit of the message vector 352 by a given number of repetitions (e.g., $d_2, d_3, \ldots d_{MAX}$). Here, the number of repetition of each bit represents a degree. For example, an operator for a node of a degree of '2' repeats each of message bits '$k_2$' two times, thereby generating an outer codeword bit, and an operator for a node of a degree of '3' repeats each of message bits '$k_3$' three times, thereby generating an outer codeword bit, and an operator for a node of a degree of '$d_{MAX}$' repeats each of message bits '$k_{d_{MAX}}$' '$d_{MAX}$' times, thereby generating an outer codeword bit.

In the example of FIG. 3, as described above, an operation of a degree of '2' is carried out about three bits, and an operation of a degree of '3' is carried out about one bit, and an operation of a degree of '$d_{MAX}$' is carried out about one bit, although the embodiment of the present invention is not limited thereto.

Outer decoding 328 of a receiving node corresponding to the outer encoding 312 can be carried out through the summation of values generated through inner decoding 324. Referring to FIG. 3, the outer decoding 328 receives an input of '$L_{di}$' and outputs '$L_b$'. At this time, in an iterative decoding process through interleaving, a value of '$L_{dt}$' can be re-determined using input values of '$L_1$' to '$L_{di-1}$'. Here, the input to the outer decoding 328 can be a Log Likelihood Ratio (LLR) value. For example, the inner encoding 316 can use a rate-1 trellis code.

Figure 4:
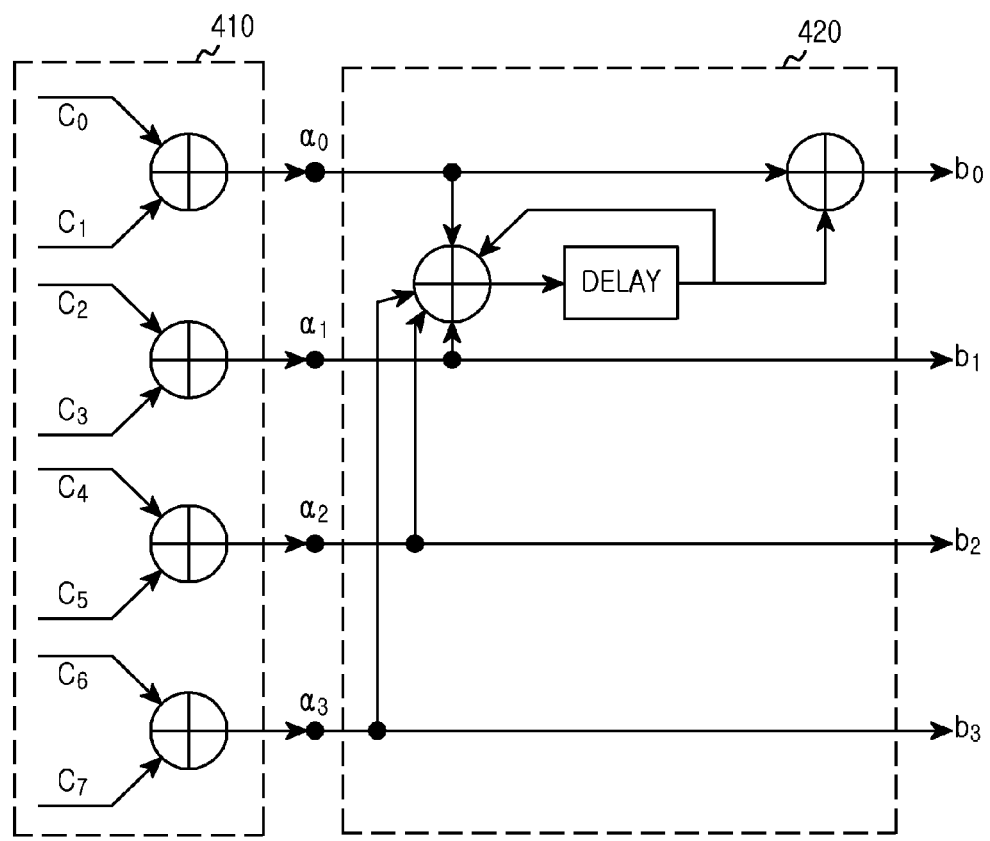
FIG. 4 illustrates inner encoding in a wireless communication system according to an embodiment of the present invention.

FIG. 4 illustrates inner encoding in a wireless communication system according to an embodiment of the present invention. Specifically, FIG. 4 illustrates an FQAM modulation order being equal to 16.

Referring to FIG. 4, the inner encoding is carried out through bit grouping 410 and delay summation 420. Specifically, $a_0$ is generated from a sum of $c_0$ and $c_1$, $a_1$ is generated from a sum of $c_2$ and $c_3$, $a_2$ is generated from a sum of $c_4$ and $c_5$, and $a_3$ is generated from a sum of $c_6$ and $c_7$. Thereafter, $b_0$ to $b_3$ are generated from the $a_0$ to the $a_3$. More specifically, $b_0$ is generated from a sum of $a_0$ and a sum of $a_0$ to the $a_3$. The sum of $a_0$ to the $a_3$ is fed back after delay of a certain time, thereby affecting generation of a next $b_0$. $b_1$ is the same as $a_1$, $b_2$ is the same as $a_2$, and $b_3$ is the same as $a_3$.

Figure 5:
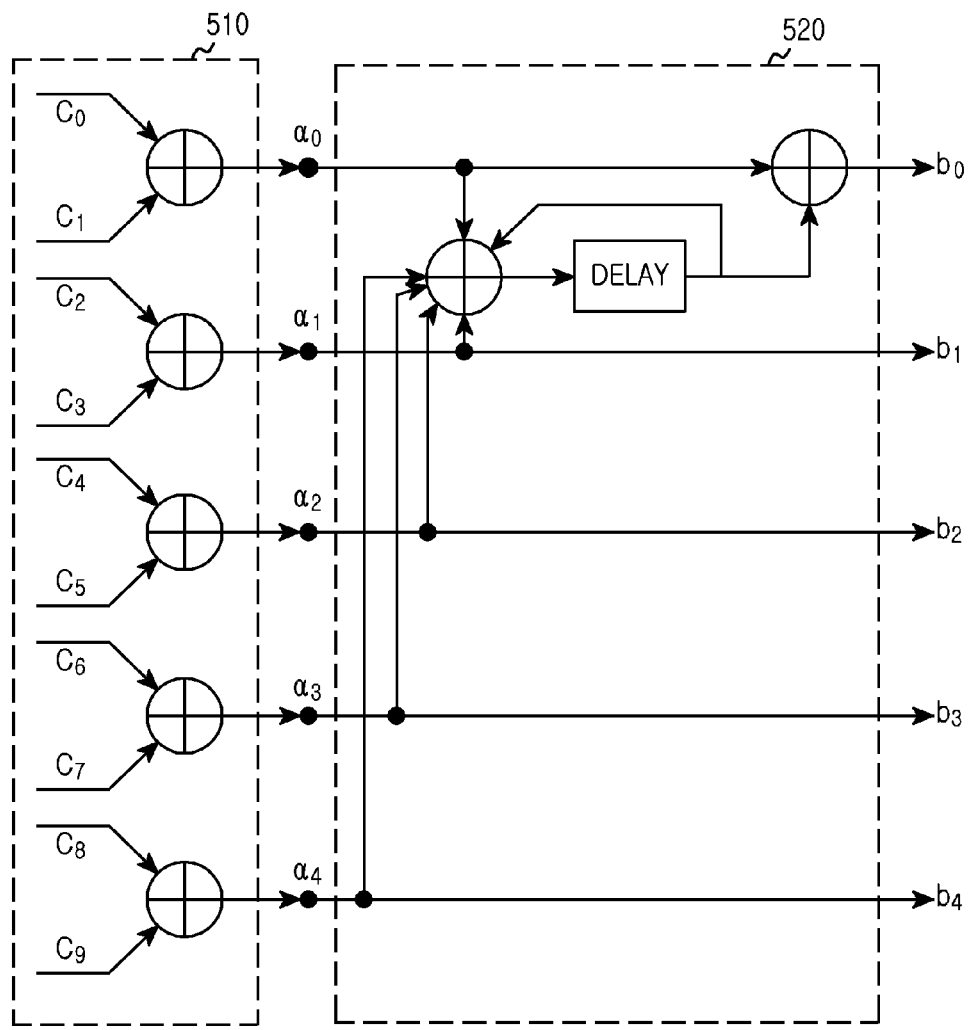
FIG. 5 illustrates inner encoding in a wireless communication system according to another embodiment of the present invention.

FIG. 5 illustrates inner encoding in a wireless communication system according to another embodiment of the present invention. Specifically, FIG. 5 illustrates an FQAM modulation order being equal to 32.

Referring to FIG. 5, the inner encoding is carried out through bit grouping 510 and delay summation 520. Specifically, $a_0$ is generated from a sum of $c_0$ and $e_1$, $a_1$ is generated from a sum of $c_2$ and $c_3$, $a_2$ is generated from a sum of $c_4$ and $c_5$, $a_3$ is generated from a sum of $c_0$ and $c_7$, and $a_4$ is generated from a sum of $c_8$ and $c_9$. Thereafter, $b_0$ to $b_4$ are generated from $a_0$ to the $a_4$. Specifically, $b_0$ is generated from a sum of $a_0$ and a sum of $a_0$ to $a_4$. The sum of $a_0$ to the $a_4$ is fed back after a delay of a certain time, thereby affecting the generation of a next $b_0$. $b_1$ is the same as $a_1$, $b_2$ is the same as $a_2$, $b_3$ is the same as $a_3$, and $b_4$ is the same as $a_4$.

Through the encoding and decoding illustrated in FIG. 2 to FIG. 5, the encoding and decoding effective to the FQAM modulation scheme can be carried out. More specifically, in the encoding and decoding illustrated in FIGS. 2 and 3, a detailed structure of inner encoding and outer encoding can be designed in accordance to the purposes of various schemes. For example, various structures can be constructed in which degree distributions of the outer encoding are different from one another. The degree distribution represents how many times each of bit summation operations having different degrees is repeated. For example, all of the summation operations of the different degrees can be repeated regularly at equal times, or the number of repetition for a summation operation of a specific degree can be different from the number of repetition of summation operations of other degrees.

If only one channel code is used, without considering a non-Gaussianity of a channel, performance degradation may occur. For example, if the non-Gaussianity of the channel is low, i.e., if an interference signal follows a distribution similar to a Gaussian, a channel code designed considering an environment in which the non-Gaussianity of the channel is great may have poor performance.

FIGS. 6 to 9 are graphs illustrating performance of an encoding and decoding scheme based on a non-Gaussianity. Specifically, FIGS. 6 to 9 illustrate a simulation experiment result of encoding performance based on a non-Gaussianity of a channel.

Referring to FIGS. 6 to 9, code 1 represents a code optimized for an environment having small non-Gaussianity, i.e., an environment in which an interference signal follows a distribution similar to a Gaussian, and code 2 represents a code optimized for an environment having large non-Gaussianity, i.e., an environment in which an interference signal has a distribution that differs more significantly from a Gaussian.

To determine the non-Gaussianity, a Complex Generalized Gaussian (CGG) model, i.e., one example of a non-Gaussian channel model, has been used. The CGG model assumes that an interference signal or noise follows a CGG distribution. A probability density function (pdf) of the CGG distribution used in the CGG model is shown in Equation (1) below.

$$f_z(z \mid \alpha, \beta) = \frac{\alpha}{2\pi\beta^2 \Gamma\left(\frac{2}{\alpha}\right)} \exp\left(-\left(\frac{|z|}{\beta}\right)^\alpha\right) \quad (1)$$

In Equation (1), '$f_z$' denotes a pdf of a noise, '$z$' is variable indicating the noise, '$\alpha$' is a shape parameter for expressing the extent of a non-Gaussian, '$\beta$' is a scale parameter for expressing a variance, and '$\Gamma$' is a gamma function defined as '$\Gamma(z) \triangleq \int_0^\infty t^{z-1} \exp(-t) dt$'.

In Equation (1), the pdf of the CGG distribution follows a Gaussian distribution, if the '$\alpha$' is equal to 2, follows a super Gaussian distribution having a heavy-tail, if '$\alpha$' is less than 2, and follows a sub Gaussian distribution having a light-tail if '$\alpha$' is larger than 2. That is, if '$\alpha$' is equal to 2, the CGG model is the same as a Gaussian model.

Most interference signals and noises are modeled as a super Gaussian or Gaussian in which '$\alpha$' is 0 to 2. '$\beta$', which is called the scale parameter, plays the same role as a variance of a Gaussian pdf. Most pdfs used in a non-Gaussian decoding scheme include the shape parameter '$\alpha$' and scale parameter '$\beta$' of the CGG distribution. Accordingly, although embodiments of the present invention describe CGG distribution, for example, the embodiments of the present invention are identically applicable o most existing non-Gaussian models.

Figure 6:
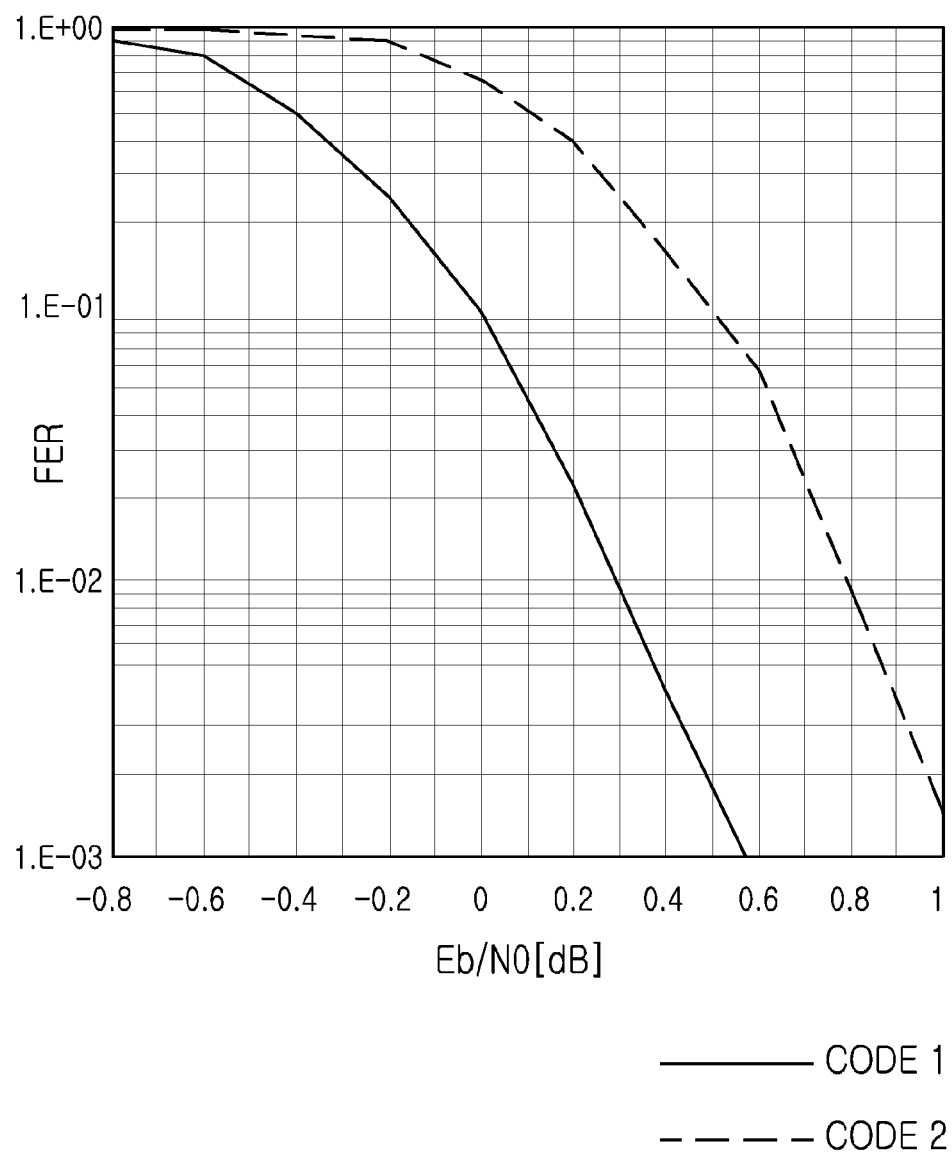
FIGS. 6 to 9 are graphs illustrating performance of an encoding and decoding method based on a non-Gaussianity.

Referring to FIG. 6, when a Frame Error Rate (FER) is equal to $10^{-2}$, the code 1 has better performance by about 0.5 decibels (dB) in an AWGN channel environment than code 2.

Figure 7:
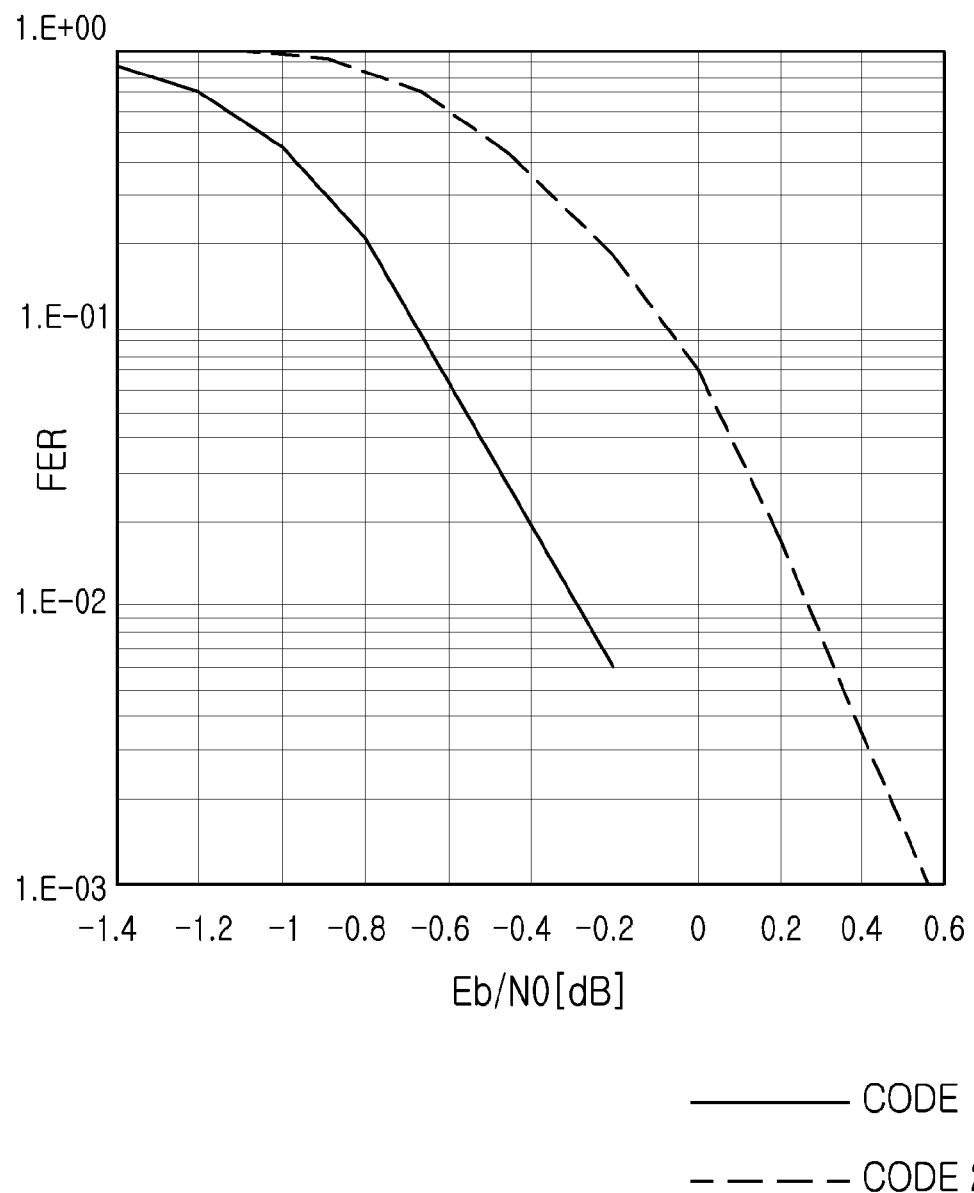

Referring to FIG. 7, when the FER is equal to $10^{-2}$, code 1 has better performance by about 0.6 dB than code 2, similarly to the AWGN channel environment of FIG. 6, in a channel environment in which the shape parameter '$\alpha$' is equal to 1.0.

Figure 8:
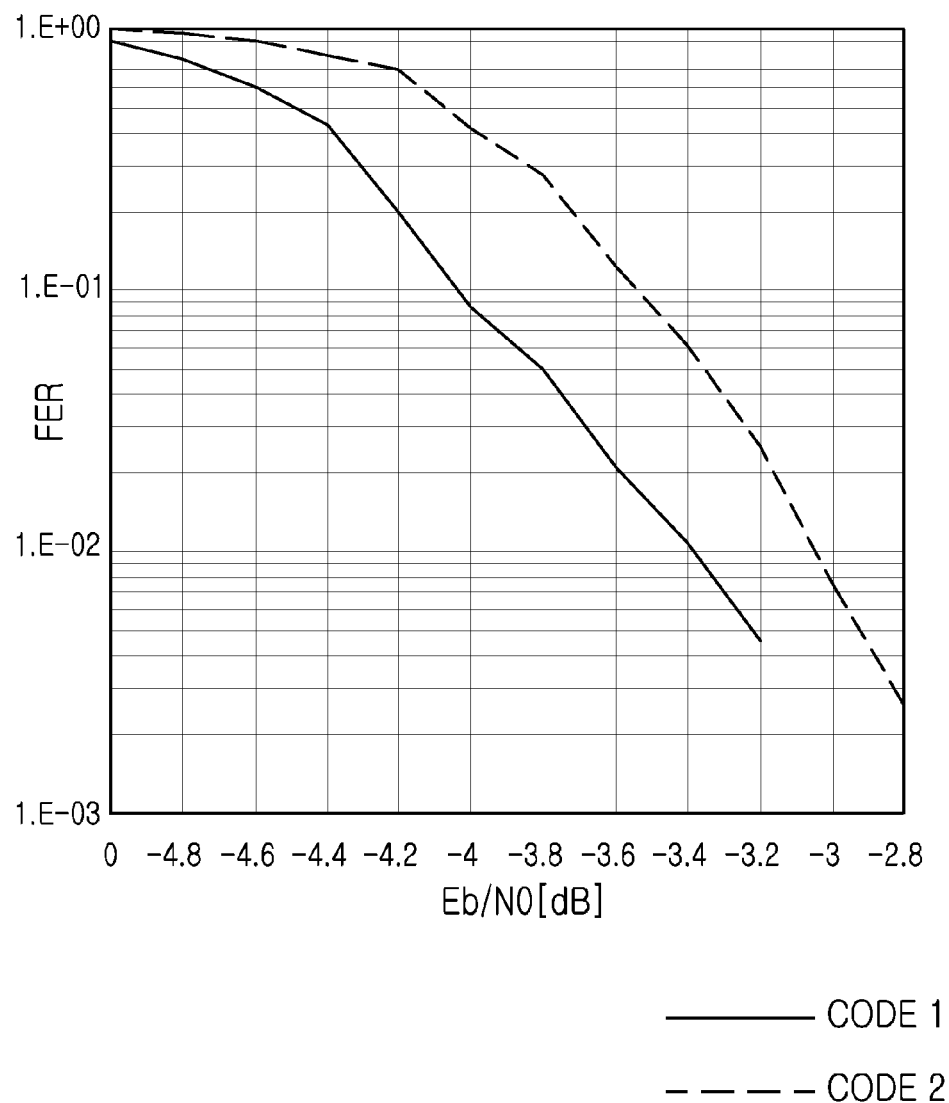

Referring to FIG. 8, when the FER is equal to $10^{-2}$, code 1 has better performance than code 2, by about 0.3 dB, in a channel environment in which the shape parameter '$\alpha$' is equal to 0.5. In FIG. 8, a performance difference between code 1 and code 2 decreases, when compared to the AWGN environment of FIG. 6.

Figure 9:
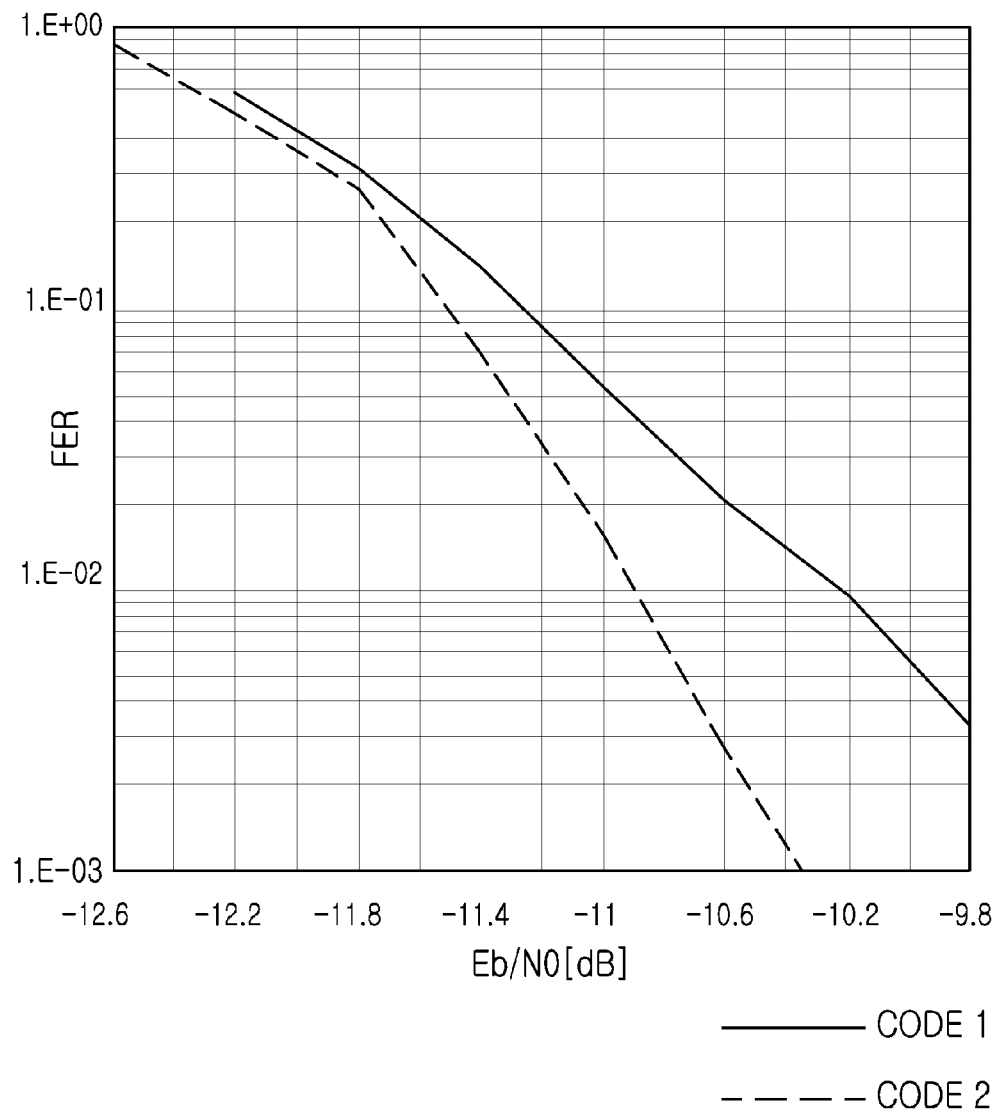

Referring to FIG. 9, when the FER is equal to $10^{-2}$, code 2 has better performance than code 1, by about 0.7 dB, in a channel environment in which the shape parameter '$\alpha$' is 0.25.

As illustrated in FIGS. 6 to 9, if a code optimized for an environment having small non-Gaussianity is used in a channel having large non-Gaussianity, performance degradation occurs, compared to a code that is optimally designed for a channel having large non-Gaussianity. Similarly, if a code optimized for an environment having large non-Gaussianity is used in a channel having small non-Gaussianity, performance degradation occurs, compared to a code that is optimally designed for a channel having small non-Gaussianity. Accordingly, an embodiment of the present invention proposes a technique for adaptively selecting a channel code in consideration of a non-Gaussianity of a channel, and performing encoding and decoding using the selected code.

In the aforementioned BICM-ID scheme, if a modulation order is given, a new code can be defined through a distribution change of an outer code. Because the outer code is constructed in an irregular repetition form, a partial decoding complexity resulting from the outer code occupies less than 1% of the whole decoding complexity. Accordingly, though a plurality of outer codes are implemented, the system complexity does not increase significantly, and an effect of using the plurality of outer codes can be obtained.

According to various embodiments of the present invention, if a terminal is located in a poor environment such as cell-edge, an FQAM modulation scheme is applied. The terminal determines a non-Gaussianity of an interference signal, and transmits, to a BS, a parameter notifying the non-Gaussianity. For description convenience, the parameter notifying the non-Gaussianity is referred to as "non-Gaussian information". For example, the non-Gaussian information can include the shape parameter '$\alpha$' of the CGG distribution, as expressed in Equation (1) above. The BS selects a code among a plurality of outer codes, based on the non-Gaussian information, and encodes transmission data using the selected code.

In accordance with an embodiment of the present invention, an outer code corresponding to a value of the non-Gaussian information can be previously defined between the BS and the terminal. In this case, to decode a received signal, the terminal selects an outer code based on the non-Gaussian information.

In accordance with another embodiment of the present invention, the outer code corresponding to the value of the non-Gaussian information can be notified to the terminal from the BS. Thereafter, the terminal decodes the signal using the notified outer code.

The embodiments of the present invention do not limit the number of encoders and decoders of the outer code. For a multi-cell, channel codes of two to four kinds can be used. If the aforementioned selective channel code, based on the non-Gaussianity, is applied, it is expected that a complexity of a decoder increases by about 1% to 2% compared to a scheme using one channel code, but a performance gain of about 0.3 dB to 0.7 dB can be obtained.

To apply selective channel code based on the non-Gaussianity, the terminal determines the non-Gaussianity. If the non-Gaussianity includes the shape parameter '$\alpha$' of the CGG distribution, the shape parameter '$\alpha$' can be estimated as shown in Equation (2) below.

$$a = \frac{\ln(3^6/2^{10})}{\ln\left(\frac{(E[|J_l[k]|])^2}{E[|J_l[k]|^2]} - \frac{\pi}{4} + \frac{9}{2^{3.5}}\right) + \ln\left(\frac{3}{2\sqrt{2}}\right)} \quad (2)$$

-continued
$$J_l[k] = Y_l[k] - \hat{H}_l[k]\hat{s}[k]\delta_{l,\hat{m}[k]}$$

In Equation (2), '$\alpha$' is a shape parameter for expressing the extent of a non-Gaussian, and '$Y_l[k]$' denotes a signal received through an $l^{th}$ subcarrier among subcarriers included in a $k^{th}$ FQAM symbol, '$\hat{H}_l[k]$' denotes a channel coefficient for the $l^{th}$ subcarrier among the subcarriers included in the $k^{th}$ FQAM symbol, '$\hat{s}[k]$' denotes a QAM transmission symbol value estimated through a hard decision about the $k^{th}$ FQAM symbol, '$\hat{m}[k]$' denotes an FSK transmission symbol value estimated through a hard decision about the $k^{th}$ FQAM symbol, and '$\delta_{l,\hat{m}[k]}$' denotes a variable, which is set to 1, if a QAM symbol is mapped to the $l^{th}$ subcarrier among the subcarriers included in the $k^{th}$ FQAM symbol, and which is set to 0 otherwise.

As shown in Equation (2), the shape parameter '$\alpha$' can be estimated based on a reception value of an FQAM symbol and a transmission value estimated through a hard decision. That is, the terminal can determine a noise and interference component using the transmission value of the FQAM symbol estimated through the hard decision, and estimate the shape parameter '$\alpha$' based on a squared value of an average of the noise and interference component and an average value of a square of the noise and interference component. For example, the hard decision can be carried out as shown in Equation (3).

$$(\hat{m}[k], \hat{s}[k]) = \underset{(m_j[k], s_i[k]) \in C}{\operatorname{argmin}} \sum_{l=1}^{M_F} |Y_l[k] - \hat{H}_l[k]s_i[k]\delta_{m_j[k],l}|^2 \quad (3)$$

In Equation (3), '$\hat{s}[k]$' denotes a QAM transmission symbol value estimated through a hard decision about a $k^{th}$ FQAM symbol, '$\hat{m}[k]$' denotes an FSK transmission symbol value estimated through the hard decision about the $k^{th}$ FQAM symbol, '$M_F$' denotes the number of subcarriers included in an FQAM symbol, '$s_i[k]$' denotes a QAM symbol mapped to a subcarrier activated in the $k^{th}$ FQAM symbol, '$m_j[k]$' denotes an index of the subcarrier activated in the $k^{th}$ FQAM symbol, 'C' denotes a set of transmissible FQAM symbols, '$Y_l[k]$' denotes a signal received through an $l^{th}$ subcarrier among subcarriers included in the $k^{th}$ FQAM symbol, '$\hat{H}_l[k]$' denotes a channel coefficient for the $l^{th}$ subcarrier among the subcarriers included in the kth FQAM symbol, and '$\delta_{m_j[k],l}$' denotes a variable, which is set to 1, if a $j^{th}$ subcarrier among the subcarriers included in the $k^{th}$ FQAM symbol is activated, and which is set to 0 otherwise.

As shown in Equation (3), the hard decision can be performed based on a reception value and a product of a transmission candidate value of an FQAM symbol and a channel coefficient. That is, the terminal searches for an FQAM symbol candidate having a minimal difference between the reception value and a product of the channel coefficient and each of transmission candidate values of the FQAM symbol, thereby being able to decide the hard decision value.

Figure 10:
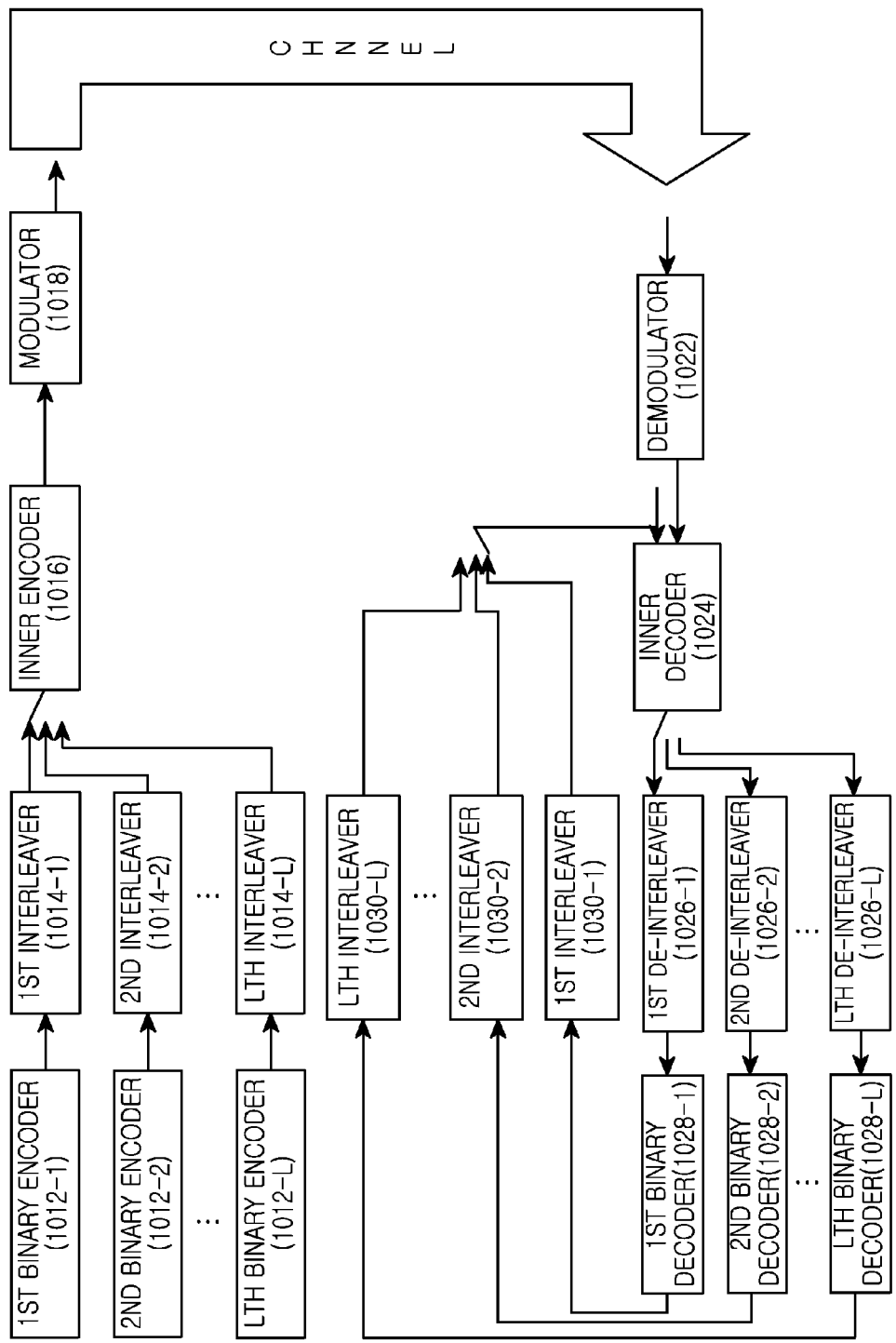
FIG. 10 illustrates an encoding and decoding structure in a wireless communication system according to an embodiment of the present invention.

FIG. 10 illustrates an encoding and decoding structure in a wireless communication system according to an embodiment of the present invention.

Referring to FIG. 10, a transmitting node includes a plurality of binary encoders 1012-1 to 1012-L for performing binary encoding based outer encoding for a transmission bit stream, a plurality of interleavers 1014-1 to 1014-L for interleaving the binary encoded bit stream, an inner encoder 1016 for performing trellis based inner encoding for the interleaved bit stream, and a modulator 1018 for mapping the inner encoded bit stream to a complex symbol.

In accordance with an embodiment of the present invention, the plurality of binary encoders 1012-1 to 1012-L have different degree distributions. For example, an operation of a degree of $D_1$ in the first binary encoder 1012-1 can be repeated $N_1$ times, and an operation of a degree of $D_1$ in the second binary encoder 1012-2 can be repeated $N_2$ times. The plurality of binary encoders 1012-1 to 1012-L and the plurality of interleavers 1014-1 to 1014-L have a point to point corresponding relationship.

A receiving node includes a demodulator 1022 for demapping a complex symbol to a bit stream, an inner decoder 1024 for performing trellis based inner decoding for the demapped bit stream, a plurality of de-interleavers 1026-1 to 1026-L for de-interleaving the inner decoded bit stream using a rule corresponding to the interleaving of the transmitting node, a plurality of binary decoders 1028-1 to 1028-L for performing binary based outer decoding for the de-interleaved bit stream, and a plurality of interleavers 1030-1 to 1030-L for interleaving the outer decoded bit stream.

In accordance with an embodiment of the present invention, the plurality of binary decoders 1028-1 to 1028-L have different degree distributions. For example, an operation of a degree of $D_1$ in the first binary decoder 1028-1 can be repeated $N_1$ times, and an operation of a degree of $D_1$ in the second binary decoder 1028-2 can be repeated at $N_2$ times. The plurality of binary decoders 1028-1 to 1028-L and the plurality of de-interleavers 1026-1 to 1026-L have a point to point corresponding relationship. The plurality of binary decoders 1028-1 to 1028-L and the plurality of interleavers 1030-1 to 1030-L also have a point to point corresponding relationship.

Figure 11:
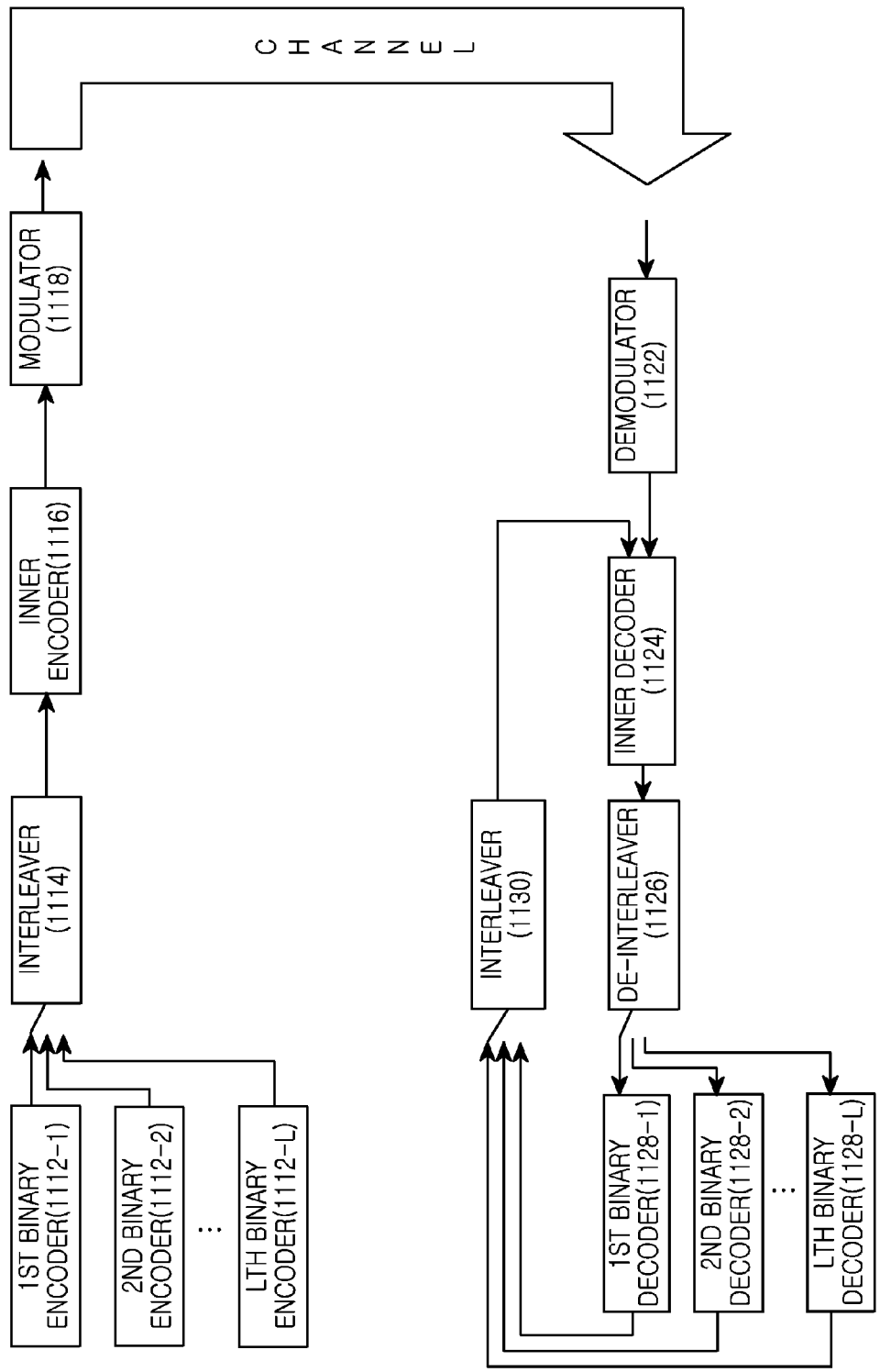
FIG. 11 illustrates an encoding and decoding structure in a wireless communication system according to an embodiment of the present invention.

FIG. 11 illustrates an encoding and decoding structure in a wireless communication system according to another embodiment of the present invention.

Referring to FIG. 11, a transmitting node includes a plurality of binary encoders 1112-1 to 1112-L for performing binary encoding based outer encoding for a transmission bit stream, an interleaver 1114 for interleaving the binary encoded bit stream, an inner encoder 1116 for performing trellis based inner encoding for the interleaved bit stream, and a modulator 1118 for mapping the inner encoded bit stream to a complex symbol. In accordance with an embodiment of the present invention, the plurality of binary encoders 1112-1 to 1112-L have different degree distributions. For example, a repetition degree for $N_1$ inputs in the first binary encoder 1112-1 can be $D_1$, and a repetition degree for $N_1$ inputs in the second binary encoder 1112-2 can be $D_2$.

A receiving node includes a demodulator 1122 for demapping a complex symbol to a bit stream, an inner decoder 1124 for performing trellis based inner decoding for the demapped bit stream, a de-interleaver 1126 for de-interleaving the inner decoded bit stream using a rule corresponding to the interleaving of the transmitting node, a plurality of binary decoders 1128-1 to 1128-L for performing binary based outer decoding for the de-interleaved bit stream, and an interleaver 1130 for interleaving the outer decoded bit stream.

In accordance with an embodiment of the present invention, the plurality of binary decoders 1128-1 to 1128-L have different degree distributions. For example, a repetition degree for $N_1$ inputs in the first binary decoder 1128-1 can be $D_1$, and a repetition degree for $N_1$ inputs in the second binary decoder 1128-2 can be $D_2$.

Figure 12:
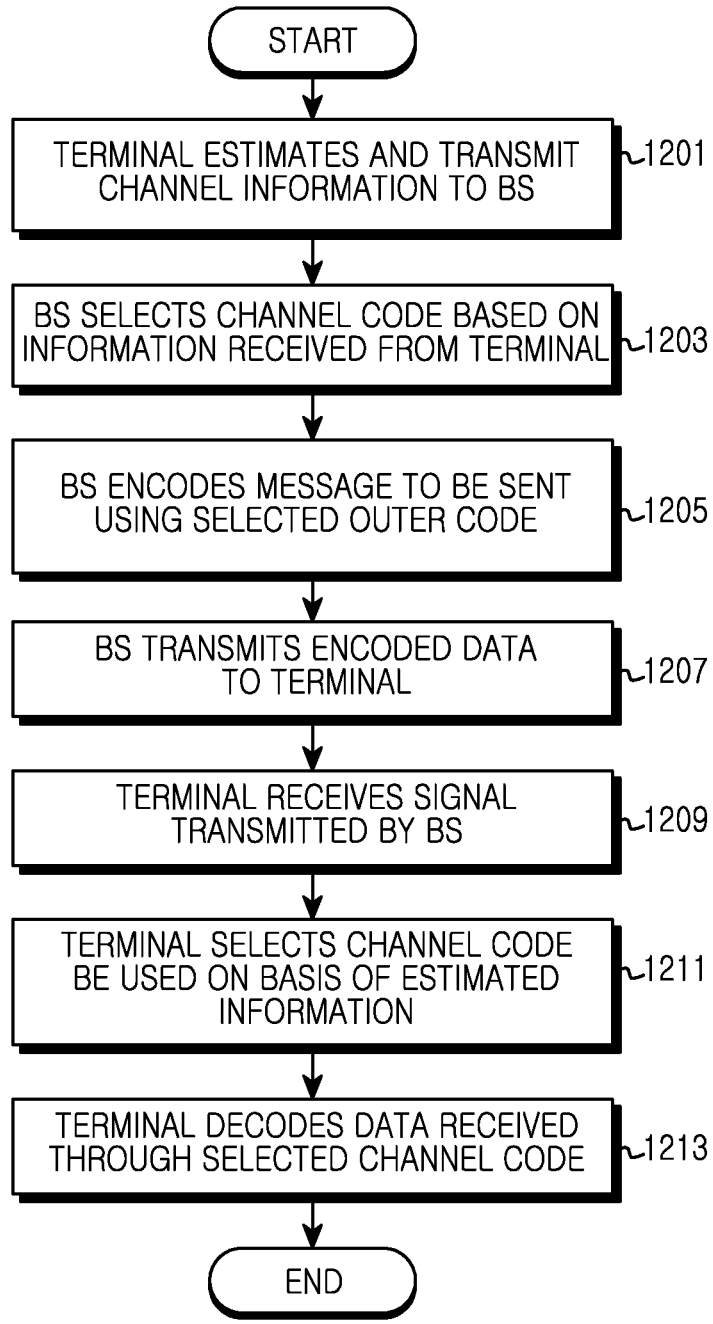
FIG. 12 is a flowchart illustrating an encoding and decoding procedure in a wireless communication system according to an embodiment of the present invention.

FIG. 12 is a flowchart illustrating an encoding and decoding procedure in a wireless communication system according to an embodiment of the present invention.

Referring to FIG. 12, in step 1201, a terminal estimates channel information, and transmits the estimated channel information to a BS. The channel information includes non-Gaussian information representing a non-Gaussianity of a channel. For example, the non-Gaussian information can include a shape parameter of a CGG distribution. If the shape parameter is included, the terminal can estimate a transmission symbol through a hard decision, and estimate the shape parameter using the transmission symbol estimated through the hard decision.

In step 1203, the BS selects a channel code based on the information received from the terminal. For example, the BS selects one outer code among a predefined plurality of outer codes based on the non-Gaussian information. The plurality of outer codes can have different degree distributions. For example, the larger the non-Gaussianity of the channel is, the outer code having a relatively more regular degree distribution is selected, i.e., the more regular a degree distribution of an outer code is. If a first outer code is selected based on a lower non-Gaussianity and a second outer code is selected based on a higher non-Gaussianity, a degree distribution of the second outer code is more regular than a degree distribution of the first outer code.

In step 1205, the BS encodes a message to be sent using the selected outer code. The message represents a transmission unit of transmission data. That is, the BS performs iterative encoding in accordance to a degree distribution defined in the selected outer code. In addition, the BS performs inner encoding, after interleaving an outer encoded bit stream. For example, the inner encoding can be carried out through a trellis based code.

In step 1207, the BS transmits encoded data to the terminal. For example, the BS can map the encoded data to complex symbols, convert the complex symbols into a baseband analog signal, and up convert the baseband analog signal into a Radio Frequency (RF) band signal. Here, the complex symbols can include FQAM symbols.

In step 1209, the terminal receives the signal transmitted by the BS, e.g., an RF band signal. Accordingly, the terminal can down convert the RF band signal received through an antenna into a baseband signal, convert the baseband signal into a digital signal, and perform demodulation. Through the demodulation, the terminal can generate LLR values.

In step 1211, the terminal selects a channel code to be used by a decoder based on the channel information. That is, the terminal selects an outer code to be used by a decoder corresponding to the channel code used for encoding in the BS based on the non-Gaussianity estimated in step 1201. For example, the terminal selects one outer code among a predefined plurality of outer codes based on the non-Gaussian information. The plurality of outer codes can have different degree distributions. For example, the outer code having a relatively more regular degree distribution is selected if the non-Gaussianity is relatively larger. That is, the larger the non-Gaussianity of the channel is, the more regular a degree distribution of an outer code is. If a first outer code is selected based on a lower non-Gaussianity and a second outer code is selected based on a higher non-Gaussianity, a degree distribution of the second outer code is more regular than a degree distribution of the first outer code. In accordance with another embodiment of the present invention, the terminal can select the decoder in accordance to an instruction from the BS.

In step 1213, the terminal performs decoding for data received using the selected outer code. Prior to this, the terminal can perform inner decoding of the received data and, after de-interleaving, perform outer decoding using the selected outer code.

After interleaving the outer decoding result, the terminal can perform iterative decoding, performing inner decoding. The number of repetitions of the interleaving and inner decoding can be previously defined or be decided in accordance to a predefined rule.

Although FIG. 12 illustrates downlink communication, the adaptive encoding and decoding technique based on the non-Gaussianity of the channel according to an embodiment of the present invention can also be applied to uplink communication.

For example, if reciprocity between an uplink channel and a downlink channel is recognized, a BS can select a channel code based on non-Gaussian information received from a terminal. Accordingly, the BS can notify the selected channel code to the terminal or, without notification from the BS, the terminal can select the channel code in accordance to the non-Gaussian information.

As another example, the BS can estimate non-Gaussian information using a signal received from the terminal, and select a channel code based on the non-Gaussian information. Accordingly, the BS can notify the non-Gaussian information or the selected channel code to the terminal.

Figure 13:
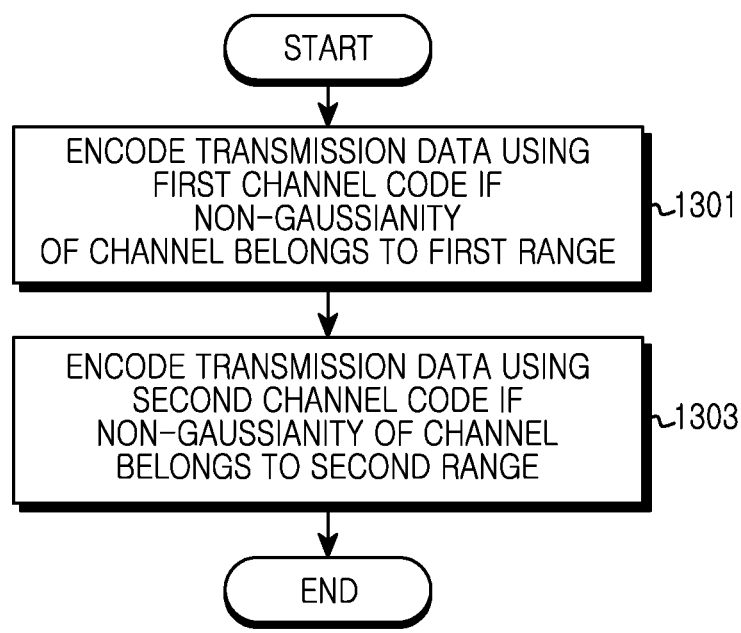
FIG. 13 is a flowchart illustrating an operation procedure of a transmitting node in a wireless communication system according to an embodiment of the present invention.

FIG. 13 is a flowchart illustrating an operation procedure of a transmitting node in a wireless communication system according to an embodiment of the present invention.

Referring to FIG. 13, in step 1301, the transmitting node encodes transmission data using a first channel code, if a non-Gaussianity of a channel falls within to a first range. Specifically, the transmitting node can perform outer encoding using the repetition code, interleave the outer encoded bit stream, and inner encode the interleaved bit stream. Here, the pattern of the interleaving can be different in accordance to a characteristic of the repetition code, or have no relation to the characteristic of the repetition code.

In step 1303, the transmitting node encodes the transmission data using a second channel code, if the non-Gaussianity of the channel falls within a second range. Specifically, the transmitting node can perform outer encoding using the repetition code, interleave the outer encoded bit stream, and inner encode the interleaved bit stream. Here, the pattern of the interleaving can be different in accordance to a characteristic of the repetition code, or have no relation to the characteristic of the repetition code. Further, the first channel code and the second channel code have degree distributions of the different repetition codes. For example, the channel code having a relatively more regular degree distribution of the repetition code is selected if the non-Gaussianity is relatively larger. That is, the larger the non-Gaussianity of the channel is, the more regular a degree distribution of a channel code is.

In FIG. 13, the transmitting node performs encoding using the first channel code and the second channel code. However, in accordance to another embodiment of the present invention, the transmitting node can support three or more channel codes. In this case, if the non-Gaussianity of the channel falls within a third range, the transmitting node encodes the transmission data using a $3^{rd}$ channel code. That is, if the non-Gaussianity of the channel falls within an $n^{th}$ range, the transmitting node can encode the transmission data using an $n^{th}$ channel code.

Although not illustrated in FIG. 13, after performing the encoding, the transmitting node can map a bit stream encoded through modulation to complex symbols. The complex symbols can include FQAM symbols.

Also, although not illustrated in FIG. 13, to determine the non-Gaussianity of the channel, the transmitting node can receive information notifying the non-Gaussianity from the receiving node, or the transmitting node can estimate the non-Gaussianity using a signal received from the receiving node. For example, the information notifying the non-Gaussianity can include a shape parameter of a CGG distribution.

Figure 14:
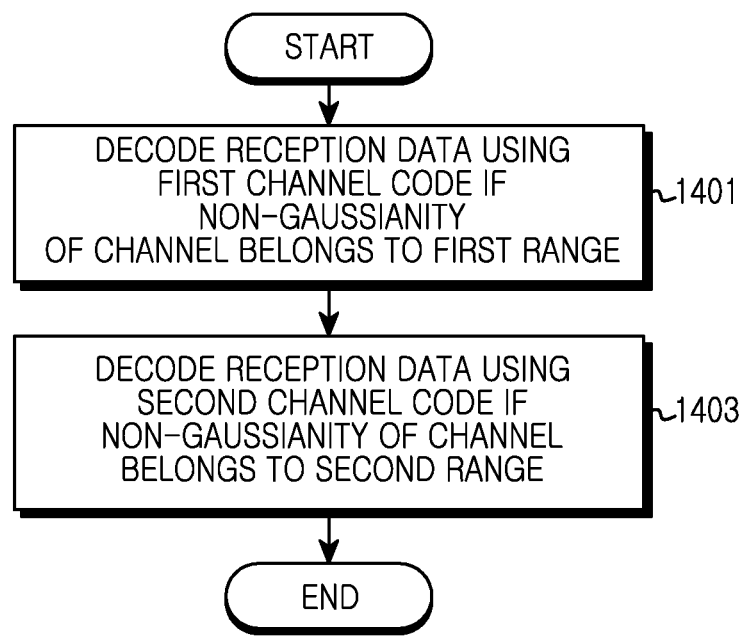
FIG. 14 is a flowchart illustrating an operation procedure of a receiving node in a wireless communication system according to an embodiment of the present invention.

FIG. 14 is a flowchart illustrating an operation procedure of a receiving node in a wireless communication system according to an embodiment of the present invention.

Referring to FIG. 14, in step 1401, if a non-Gaussianity of a channel falls within a first range, the receiving node decodes reception data using a first channel code. Specifically, the receiving node can inner encode the reception data, de-interleave the inner decoded bit stream, perform outer decoding using the repetition code corresponding to the first range which the non-Gaussianity belongs to, interleave the outer decoded bit stream, and inner decode the interleaved bit stream. Here, the pattern of the interleaving and the de-interleaving can be different depending on a characteristic of the repetition code, or have no relation to the characteristic of the repetition code.

In step 1403, and the receiving node decodes the reception data using a second channel code, if the non-Gaussianity of the channel falls within a second range. Specifically, the receiving node can inner decode the reception data, de-interleave the inner decoded bit stream, perform outer decoding using the repetition code corresponding to the second range which the non-Gaussianity falls within, interleave the outer decoded bit stream, and inner decode the interleaved bit stream. Here, the pattern of the interleaving and the de-interleaving can be different in accordance to a characteristic of the repetition code, or have no relation to the characteristic of the repetition code. Further, the first channel code and the second channel code have different degree distributions of the repetition codes. For example, the channel code having a relatively more regular degree distribution of the repetition code is selected if the non-Gaussianity is relatively larger. That is, the larger the non-Gaussianity of the channel is, the more regular a degree distribution of a channel code is.

In FIG. 14, the receiving node performs decoding using the first channel code and the second channel code. However, in accordance with another embodiment of the present invention, the receiving node can support three or more channel codes. In this case, if the non-Gaussianity of the channel falls within a $3^{rd}$ range, the receiving node decodes data using a $3^{rd}$ channel code. That is, if the non-Gaussianity of the channel falls within an $n^{th}$ range, the receiving node can decode the data using an $n^{th}$ channel code.

Although not illustrated in FIG. 14, prior to performing the decoding, the receiving node can perform demodulation for complex symbols including FQAM symbols.

Also, although not illustrated in FIG. 14, to determine the non-Gaussianity, the receiving node can estimate the non-Gaussianity using a signal received from the transmitting node, and the receiving node can transmit information notifying the non-Gaussianity to the transmitting node. For example, the information notifying the non-Gaussianity can include a shape parameter of a CGG distribution.

Figure 15:
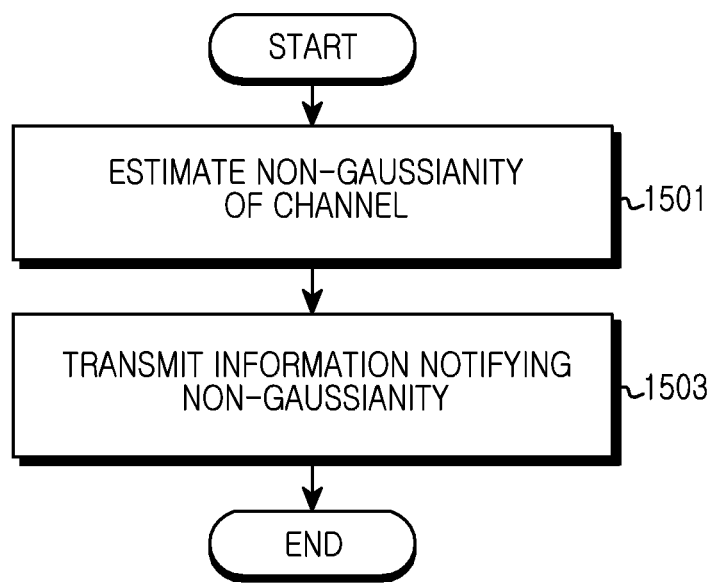
FIG. 15 is a flowchart illustrating an operation procedure of a receiving node in a wireless communication system according to another exemplary embodiment of the present invention.

FIG. 15 is a flowchart illustrating an operation procedure of a receiving node in a wireless communication system according to another embodiment of the present invention.

Referring to FIG. 15, in step 1501, the receiving node estimates a non-Gaussianity of a channel. For example, the receiving node searches for an FQAM symbol candidate having a minimal difference between a reception value and a product of a channel coefficient and a transmission candidate value of the FQAM symbol, thereby being able to decide a hard decision value. The hard decision value may be decided as in Equation (3) above.

The receiving node can estimate the non-Gaussianity based on the hard decision value and the reception value of the FQAM symbol. Specifically, the receiving node can decide a noise and interference component using the transmission value of the FQAM symbol estimated through the hard decision, and estimate the non-Gaussianity based on a squared value of an average of the noise and interference component and an average value of a square of the noise and interference component. For example, the non-Gaussianity can be decided as shown in Equation (2) above.

In step 1503, the receiving node transmits information notifying the non-Gaussianity. The non-Gaussianity represents whether an interference or noise of a channel follows a non-Gaussian distribution, the extent of a non-Gaussian, etc. For example, the information notifying the non-Gaussianity can include a shape parameter of a CGG distribution.

Figure 16:
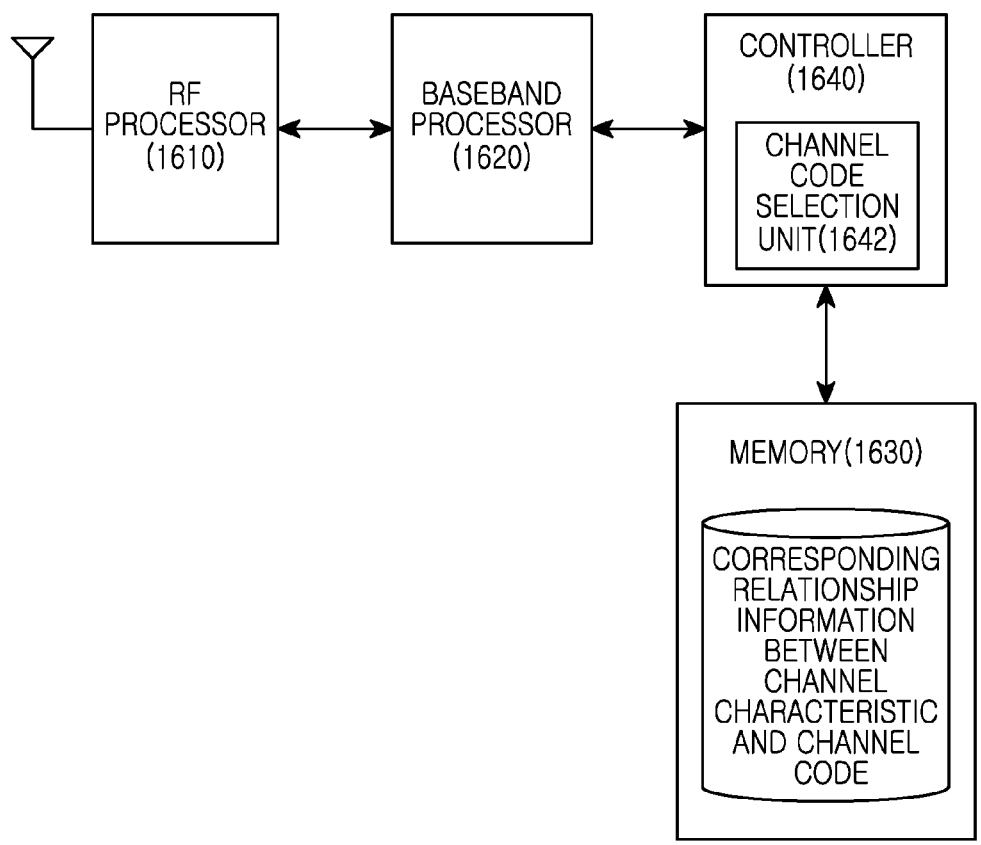
FIG. 16 illustrates a communication device in a wireless communication system according to an embodiment of the present invention.

FIG. 16 illustrates a communication device in a wireless communication system according to an embodiment of the present invention. Specifically, the communication device illustrated in FIG. 16 can operate as a transmitting node or a receiving node.

Referring to FIG. 16, the communication device includes an RF processor 1610, a baseband processor 1620, a memory 1630, and a controller 1640.

The RF processor 1610 transmits/receives a signal through a wireless channel, using signal band conversion, amplification, etc. That is, the RF processor 1610 up converts a baseband signal provided from the baseband processor 1620 into an RF band signal and then transmits the RF band signal through an antenna, and down converts an RF band signal received through the antenna into a baseband signal. For example, the RF processor 1610 can include a transmission filter, a reception filter, an amplifier, a mixer, an oscillator, a Digital to Analog Converter (DAC), an Analog to Digital Converter (ADC), etc.

Although only one antenna is illustrated in FIG. 16, the communication device may also include a plurality of antennas. Accordingly, the RF processor 1610 can include a plurality of RF chains. Further, the RF processor 1610 can perform beamforming. For the beamforming, the RF processor 1610 can adjust a phase and magnitude of each of signals transmitted/received through a plurality of antennas or antenna elements.

The baseband processor 1620 performs converts between a baseband signal and a bit stream in accordance to a physical layer standard of a system. For example, for data transmission, the baseband processor 1620 encodes and modulates a transmission bit stream, thereby being able to generate complex symbols. Further, for data reception, the baseband processor 1620 restores a reception bit stream by demodulating and decoding a baseband signal provided from the RF processor 1610. For example, the baseband processor 1620 can include at least one decoder, at least one encoder, at least one modulator, and at least one demodulator.

In accordance with an embodiment of the present invention, the baseband processor 1620 can include an encoding and decoding structure of FIG. 10 or FIG. 11. For example, the baseband processor 1620 can physically include a plurality of outer encoding modules and a plurality of outer decoding modules. As another example, the baseband processor 1620 can include at least one outer encoding module and at least one outer decoding module, which operate based on different channel codes in accordance to a control signal.

The baseband processor 1620 and the RF processor 1610 transmit and receive a signal as described above. Accordingly, the baseband processor 1620 and the RF processor 1610 can alternatively be denoted as transceiver, a transmission unit, a reception unit, a transmission/reception unit, or a communication unit.

The memory 1630 stores data of a basic program for an operation of the communication device, an application program, setting information, etc. Particularly, the memory 1630 stores corresponding relationship information between a channel characteristic and a channel code. The corresponding relationship information between the channel characteristic and the channel code indicates a channel code corresponding to a non-Gaussianity of a channel. The memory 1630 provides stored data in accordance to a request of the controller 1640.

The controller 1640 controls the general operations of the communication device. For example, the controller 1640 transmits/receives a signal through the baseband processor 1620 and the RF processor 1610. Also, the controller 1640 records data in the memory 1640, and reads the recorded data. For example, the controller 1640 can include at least one processor. In accordance with an embodiment of the present invention, the controller 1640 includes a channel code selection unit 1652 selecting a channel code in accordance to a non-Gaussianity of a channel. For example, the controller 1640 can control the communication device to perform the procedure illustrated in FIG. 13, FIG. 14, or FIG. 15.

In accordance with an embodiment of the present invention, if a non-Gaussianity of a channel falls within a first range, the controller 1640 controls the baseband processor 1620 to encode transmission data using a first channel code and, if the non-Gaussianity of the channel falls within a second range, controls the baseband processor 1620 to encode the transmission data using a second channel code. Here, the first channel code and the second channel code have different degree distributions of the repetition codes. For example, the channel code having a relatively more regular degree distribution of the repetition code is selected if the non-Gaussianity is relatively larger. That is, the larger the non-Gaussianity of the channel is, the more regular a degree distribution of a channel code is.

Further, the baseband processor 1620 can map a bit stream encoded through modulation to complex symbols including FQAM symbols. Also, to determine the non-Gaussianity of the channel, the controller 1640 can receive information notifying the non-Gaussianity from the receiving node through the RF processor 1610 and the baseband processor 1620, or the controller 1640 can estimate the non-Gaussianity using a signal received from the receiving node. For example, the information notifying the non-Gaussianity can include a shape parameter of a CGG distribution.

In accordance with an embodiment of the present invention, if a non-Gaussianity of a channel falls within a first range, the controller 1640 controls the baseband processor 1620 to encode reception data using a first channel code and, if the non-Gaussianity of the channel falls within a second range, controls the baseband processor 1620 to encode the reception data using a second channel code. Here, the first channel code and the second channel code have different degree distributions of the repetition codes. For example, the larger the non-Gaussianity of the channel is, the more regular a degree distribution of a channel code is.

Further, prior to performing the decoding, the baseband processor 1620 can perform demodulation for complex symbols including FQAM symbols. Also, to determine the non-Gaussianity, the controller 1640 can estimate the non-Gaussianity using a signal received from a transmitting node. The controller 1640 can transmit information notifying the non-Gaussianity to the transmitting node through the baseband processor 1620 and the RF processor 1610. For example, the information notifying the non-Gaussianity can include a shape parameter of a CGG distribution.

In accordance with an embodiment of the present invention, the controller 1640 can estimate a non-Gaussianity of a channel. For example, the controller 1640 searches for an FQAM symbol candidate having a minimal difference between a reception value and a product of a channel coefficient and a transmission candidate value of the FQAM symbol, thereby being able to decide a hard decision value. For example, the hard decision value can be decided as shown in Equation (3) above.

The controller 1640 can estimate the non-Gaussianity based on the hard decision value and the reception value of the FQAM symbol. Specifically, the controller 1640 can decide a noise and interference component using the transmission value of the FQAM symbol estimated through the hard decision, and estimate the non-Gaussianity based on a squared value of an average of the noise and interference component and an average value of a square of the noise and interference component. For example, the non-Gaussianity can be decided as shown in Equation (2) above.

As described above, embodiments of the present invention select a channel code in accordance to a non-Gaussianity of a channel, thereby being able to obtain optimum performance based on the non-Gaussianity of the channel. Further, embodiments of the present invention differentiate selectable channel codes as repetition code based codes through a difference of degree distributions, thereby being able to perform effective encoding and decoding at only a small complexity.

In the aforementioned embodiments of the present invention, constituent elements have been expressed in the singular number or the plural number in accordance to the proposed embodiments. However, for description convenience, the expression of the singular number or plural number is selected suitable to a proposed situation, and the present invention is not limited to singular or plural constituent elements. Even the constituent element expressed in the plural number can be constructed in the singular number, or even the constituent element expressed in the singular number can be constructed in the plural number.

Embodiments of the present invention according to the claims and description in the specification can be realized in the form of hardware, software or a combination of hardware and software.

Such software may be stored in a computer readable storage medium. The computer readable storage medium stores one or more programs (software modules), the one or more programs comprising instructions, which when executed by one or more processors in an electronic device, cause the electronic device to perform methods of the present invention.

Such software may be stored in the form of volatile or non-volatile storage such as, for example, a storage device like a Read Only Memory (ROM), whether erasable or rewritable or not, or in the form of memory such as, for example, Random Access Memory (RAM), memory chips, device or integrated circuits or on an optically or magnetically readable medium such as, for example, a Compact Disc (CD), Digital Video Disc (DVD), magnetic disk or magnetic tape or the like. It will be appreciated that the storage devices and storage media are embodiments of machine-readable storage that are suitable for storing a program or programs comprising instructions that, when executed, implement embodiments of the present invention. Embodiments provide a program comprising code for implementing apparatus or a method as claimed in any one of the claims of this specification and a machine-readable storage storing such a program. Still further, such programs may be conveyed electronically via any medium such as a communication signal carried over a wired or wireless connection and embodiments suitably encompass the same.

While the present invention has been shown and described with reference to certain embodiments thereof, it will be understood by those skilled in the art that various changes in form and details may be made therein without departing from the spirit and scope of the present invention as defined by the appended claims and any equivalents thereof.

What is claimed is:

1. A method for operating a transmitting node in a wireless communication system, the method comprising:
   receiving, from a receiving node, feedback information regarding a level of a non-Gaussianity for indicating a statistical distribution among, a plurality of candidate distributions with a non-Gaussian characteristic;
   selecting, among a plurality of channel codes, a channel code corresponding to the level of the non-Gaussianity; and
   generating transmission data by encoding data using the selected channel code,
   wherein the level of the non-Gaussianity is associated with an interference signal of a channel between the transmitting node and the receiving node.

2. The method of claim 1, wherein generating the transmission data comprises:
   outer encoding a bit stream based on a degree of distribution of a repetition code of the selected channel code;
   interleaving the outer encoded bit stream; and
   inner encoding the interleaved bit stream.

3. The method of claim 1, wherein a regularity of degree distribution of a repetition code of the selected channel code is in reverse proportion to an amount of the non-Gaussianity.

4. The method of claim 1, further comprising:
   estimating the level of the non-Gaussianity as a shape parameter of a complex generalized Gaussian (CGG) distribution.

5. The method of claim 1, further comprising:
   receiving, from the receiving node, information notifying the transmitting node of the level of the non-Gaussianity.

6. A method for operating a receiving node in a wireless communication system, the method comprising:
   receiving encoded data from a transmitting node;
   selecting, among a plurality of channel codes, a channel code corresponding to a level of the non-Gaussianity for indicating a statistical distribution among a plurality of candidate distributions with a non-Gaussian characteristic; and generating data by decoding the encoded data using the selected channel code,
wherein the level of the non-Gaussianity is associated with an interference signal of a channel between the transmitting node and the receiving node.

7. The method of claim 6, further comprising:
transmitting feedback information regarding the level of the non-Gaussianity to the transmitting node.

8. The method of claim 6, wherein generating the encoded data comprises:
inner decoding the encoded data into an inner decoded bit stream;
de-interleaving the inner decoded bit stream;
outer decoding the de-interleaved bit stream, based on a degree distribution of a repetition code of the selected channel code;
interleaving the outer decoded bit stream; and
inner decoding the interleaved bit stream.

9. The method of claim 6, wherein a regularity of degree distribution of a repetition code of the selected channel code is in reverse proportion to an amount of the non-Gaussianity.

10. The method of claim 6, further comprising
estimating the level of the non-Gaussianity as a shape parameter of a complex generalized Gaussian (CGG) distribution.

11. The method of claim 6, further comprising:
transmitting information notifying the level of the non-Gaussianity to a transmitting node.

12. An encoding device for encoding data in a wireless communication system, the encoding device comprising:
a transceiver configured to receive, from a receiving node, feedback information regarding a level of a non-Gaussianity for indicating a statistical distribution among a plurality of candidate distributions with a non-Gaussian characteristic; and
a processor configured to:
select, among a plurality of channel codes, a channel code corresponding to the level of the non-Gaussianity; and
generate transmission data by encoding data using the selected channel code,
wherein the level of the non-Gaussianity is associated with an interference signal of a channel between the transmitting node and the receiving node.

13. The encoding device of claim 12, wherein the processor is further configured to outer encode a bit stream based on a degree distribution of a repetition code of the selected channel code, to interleave the outer encoded bit stream, and inner encode the interleaved bit stream.

14. The encoding device of claim 12, wherein a regularity of degree distribution of a repetition code of the selected channel code is in reverse proportion to an amount of the non-Gaussianity.

15. The encoding device of claim 12, wherein the processor is further configured to estimate the level of the non-Gaussianity as a shape parameter of a complex generalized Gaussian (CGG) distribution.

16. The encoding device of claim 12, wherein the processor is further configured to determine the level of the non-Gaussianity using information received from a receiving node.

17. A decoding device for decoding data in a wireless communication system, the decoding device comprising:
a transceiver configured to receive encoded data from a transmitting node; and
a processor configured to:
select, among a plurality of channel codes, a channel code corresponding to a level of the non-Gaussianity for indicating a statistical distribution among a plurality of candidate distributions with a non-Gaussian characteristic; and
generate data by decoding the encoded data using the selected channel code,
wherein the level of the non-Gaussianity is associated with an interference signal of a channel between the transmitting node and the receiving node.

18. The decoding device of claim 17, wherein the transceiver is further configured to transmit feedback information regarding the level of the non-Gaussianity to the transmitting node.

19. The decoding device of claim 17, wherein the processor is further configured to inner decode the encoded data into an inner decoded bit stream, to de-interleave the inner decoded bit stream, to outer decode the de-interleaved bit stream based on a degree distribution of a repetition code of the selected channel code, to interleave the outer decoded bit stream, and to inner decode the interleaved bit stream.

20. The decoding device of claim 17, wherein a regularity of degree distribution of a repetition code of the selected channel code is in reverse proportion to an amount of the non-Gaussianity.

21. The decoding device of claim 17, wherein the processor is further configured to estimate the level of the non-Gaussianity as a shape parameter of a complex generalized Gaussian (CGG) distribution.

22. The decoding device of claim 17, wherein the transceiver is further configured to transmit information notifying the level of the non-Gaussianity to a transmitting node.

23. The method of claim 1, wherein the plurality of channel codes has different degree distributions of repetition codes.

24. The method of claim 6, wherein the plurality of channel codes has different degree distributions of repetition codes.

25. The encoding device of claim 12, wherein the plurality of channel codes has different degree distributions of repetition codes.

26. The decoding device of claim 17, wherein the plurality of channel codes has different degree distributions of repetition codes.

* * * * *